(12) United States Patent
Li et al.

(10) Patent No.: US 9,111,975 B2
(45) Date of Patent: Aug. 18, 2015

(54) LOADING MECHANISM

(75) Inventors: Bing Li, Shenzhen (CN); Yong Zhang, Shenzhen (CN); Bo Yang, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 453 days.

(21) Appl. No.: 13/484,600

(22) Filed: May 31, 2012

(65) Prior Publication Data

US 2013/0064628 A1 Mar. 14, 2013

(51) Int. Cl.
*F16H 25/14* (2006.01)
*H01L 21/677* (2006.01)
*B25J 15/02* (2006.01)
*B25J 9/10* (2006.01)

(52) U.S. Cl.
CPC ........... *H01L 21/67706* (2013.01); *B25J 9/109* (2013.01); *B25J 15/028* (2013.01); *F16H 25/14* (2013.01)

(58) Field of Classification Search
CPC ...... B25J 9/109; B25J 15/0226; B25J 15/028; B63G 47/901; F16H 19/0659; F16H 25/12; F16H 25/125; F16H 25/14; F16H 37/122; F16H 37/124; F16H 63/18; H01L 21/67706
USPC ........... 74/53, 55, 56, 57; 414/222.09, 225.01
See application file for complete search history.

(56) References Cited

U.S. PATENT DOCUMENTS

| | | | | |
|---|---|---|---|---|
| 68,900 | A * | 9/1867 | Porter et al. | 74/53 |
| 167,127 | A * | 8/1875 | Sandbach | 269/203 |
| 271,941 | A * | 2/1883 | Sleeth et al. | 279/71 |
| 648,763 | A * | 5/1900 | LaBarge | 30/436 |
| 1,399,786 | A * | 12/1921 | Messenger | 269/218 |
| 1,442,107 | A * | 1/1923 | Vernaz | 279/114 |
| 2,399,536 | A * | 4/1946 | Baum | 29/256 |
| 2,598,165 | A * | 5/1952 | Carlton | 279/114 |
| 2,690,915 | A * | 10/1954 | Pealer | 279/114 |
| 2,977,128 | A * | 3/1961 | Judelson | 279/110 |
| 3,385,595 | A * | 5/1968 | Benatar et al. | 271/95 |
| 3,703,834 | A * | 11/1972 | Beezer | 74/57 |
| 4,222,577 | A * | 9/1980 | Giffin | 279/114 |
| 4,289,040 | A * | 9/1981 | Haluko, Jr. | 74/50 |
| 4,585,240 | A * | 4/1986 | Giffin | 279/111 |
| 4,693,148 | A * | 9/1987 | Lobley | 82/165 |
| 4,762,357 | A * | 8/1988 | Bergamo | 294/119.1 |
| 4,765,669 | A * | 8/1988 | Meier | 294/119.1 |
| 4,898,416 | A * | 2/1990 | Hubbard et al. | 294/119.1 |
| 5,378,970 | A * | 1/1995 | Sato | 324/756.02 |

(Continued)

*Primary Examiner* — Saul Rodriguez
*Assistant Examiner* — Brendan Tighe
(74) *Attorney, Agent, or Firm* — Novk Druce Connolly Bove + Quigg LLP

(57) ABSTRACT

A loading mechanism includes a fastening board, a cam, a rotary pivot, and a load module. The fastening board defines a pivot hole at the center portion of the fastening board and a sliding guide adjacent to the pivot hole. The cam defines a locating hole and an annular guide. The load module includes two guiding poles, a follower fastened to one end of the two guiding poles, and a clamping member fastened to the other end of the two guiding poles. The distance between a part of the annular guide and the locating hole is gradually decreased, and the cam can be driven to rotate. The cam drives the follower to slide along the annular guide to drive the load module to slide along the sliding guide.

16 Claims, 4 Drawing Sheets

(56) References Cited

U.S. PATENT DOCUMENTS

| | | | | |
|---|---|---|---|---|
| 6,098,478 | A * | 8/2000 | Sandrock | 74/53 |
| 8,161,650 | B2 * | 4/2012 | Lawson et al. | 29/894.31 |
| 8,522,437 | B2 * | 9/2013 | Lawson et al. | 29/894.31 |
| 8,721,253 | B1 * | 5/2014 | Ebeling et al. | 414/749.1 |
| 8,769,807 | B2 * | 7/2014 | Lawson et al. | 29/783 |

* cited by examiner

LOADING MECHANISM

BACKGROUND

1. Technical Field

The present disclosure generally relates to loading mechanisms, and particularly to a rotatable loading mechanism for transferring electronic elements.

2. Description of Related Art

During a machining process, electronic components may be transferred from a first location to a second location using a loading mechanism. The loading mechanism is generally driven by a manipulator. The manipulator generally has a complicated structure and the transfer efficiency of the manipulator is unduly low.

Therefore, there is room for improvement in the art.

BRIEF DESCRIPTION OF THE DRAWINGS

The components in the drawings are not necessarily drawn to scale, the emphasis instead placed upon clearly illustrating the principles of the present disclosure. Moreover, in the drawings, like reference numerals designate corresponding parts throughout the several views.

DETAILED DESCRIPTION

Figure 1:
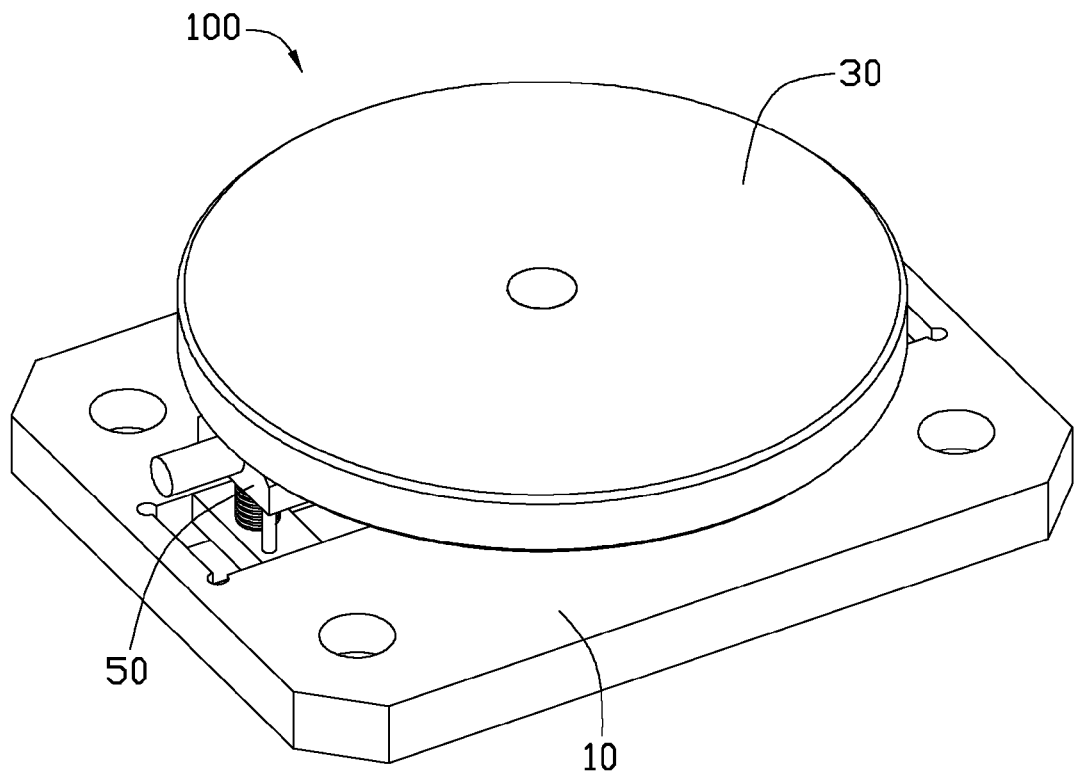
FIG. 1 is an isometric, assembled view of an embodiment of a loading mechanism with a driving device.
Figure 2:
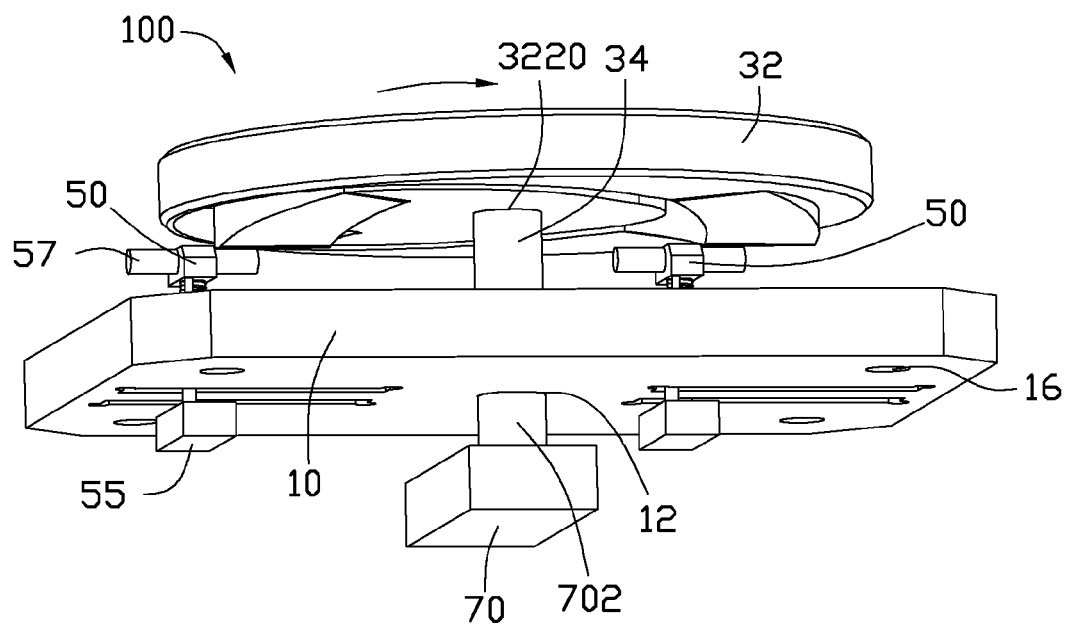
FIG. 2 is similar to FIG. 1, but viewed from another aspect.

FIGS. 1 and 2, show an embodiment of a loading mechanism 100 including a fastening board 10, a rotary module 30 rotatably fastened on the fastening board 10, and a pair of load modules 50 movably positioned between the fastening board 10 and the rotary module 30. A driving device 70 is connected to the rotary module 30 for driving the rotary module 30 to rotate.

Figure 3:
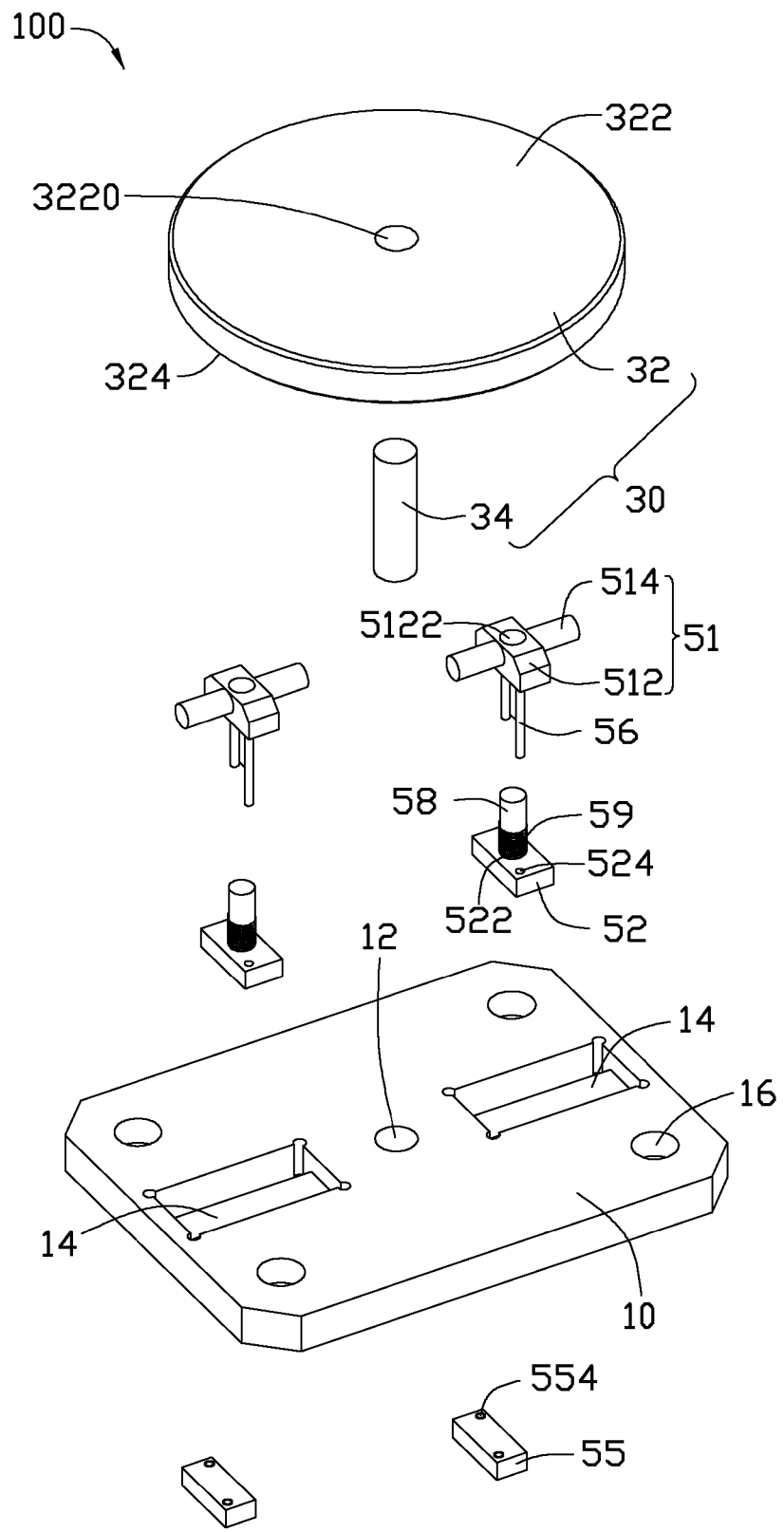
FIG. 3 is an exploded, isometric view of the loading mechanism of FIG. 1.
Figure 4:
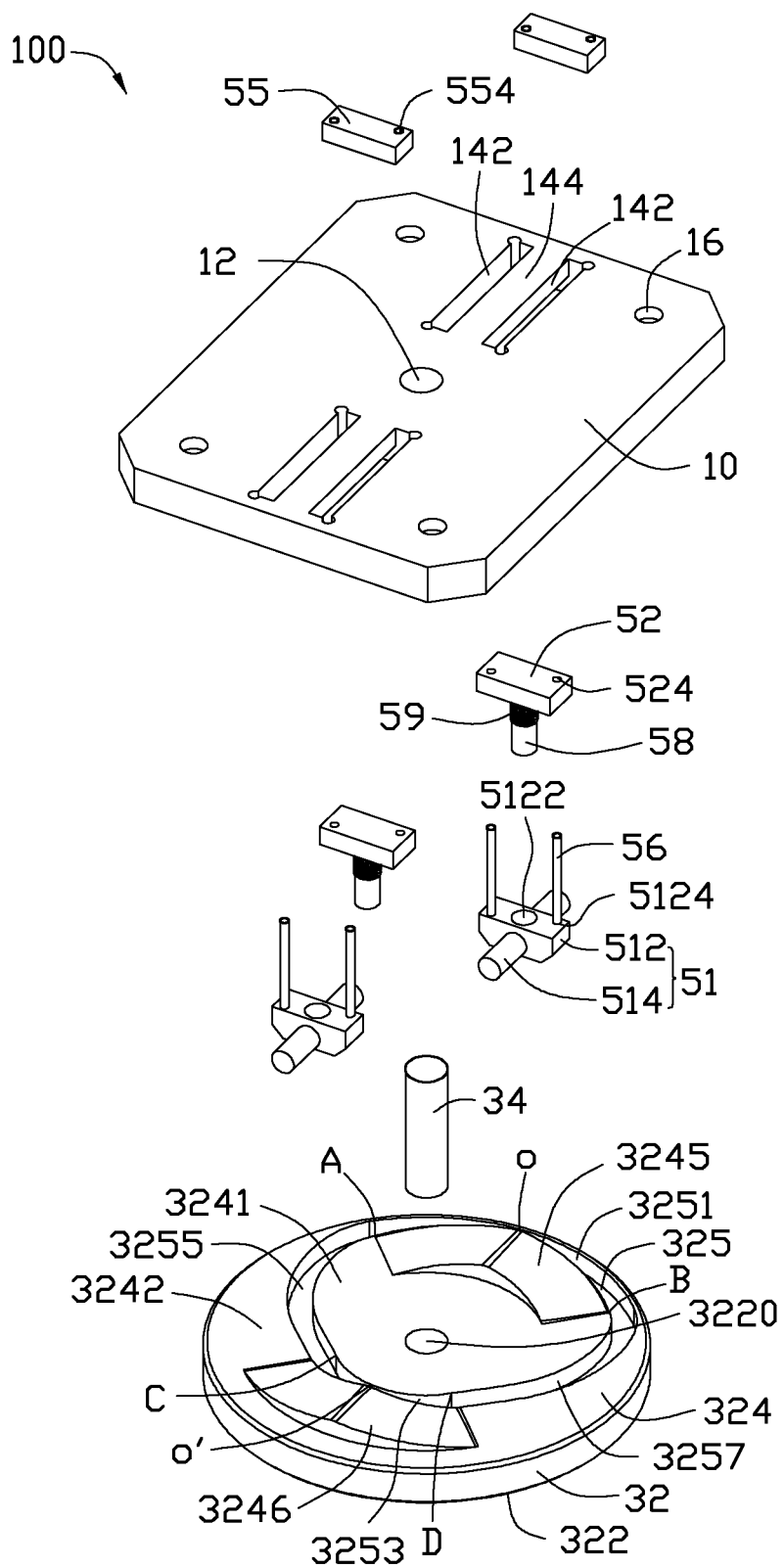
FIG. 4 is similar to FIG. 3, but viewed from another aspect.

FIGS. 3 and 4, show the fastening board 10 is a substantially rectangular board. The fastening board 10 defines a pivot hole 12 at substantially the center portion of the fastening board 10, two sliding guides 14 located adjacent to two opposite edges thereof, and four fastening holes 16 located adjacent to the four corners of the fastening board 10. In the illustrated embodiment, each of the two sliding guides 14 defines two sliding grooves 142 parallel to each other at two sides of each sliding guide 14, and a supporting portion 144 is defined between the two sliding grooves 142 of each sliding guide 14. Each of the two sliding grooves 142 is a rectangular slit.

The rotary module 30 includes a cam 32 and a rotary pivot 34 fastened to the cam 32. The cam 32 includes a first surface 322 and a second surface 324 opposite to the first surface 322. The first surface 322 is substantially parallel to the fastening board 10 and defines a locating hole 3220 at substantially the center portion of the first surface 322 corresponding to the pivot hole 12 of the fastening board 10. The locating hole 3220 coincides with the rotating center of the cam 32. In use, one end of the rotary pivot 34 is fastened in the locating hole 3220, and the other end of the rotary pivot 34 is rotatably fastened in the pivot hole 12 and connected to the driving device 70. In the illustrated embodiment, the driving device 70 is a motor, and includes a drive shaft 702. The rotary pivot 34 is non-rotatably fastened to the drive shaft 702. The driving device 70 drives the rotary pivot 34 to rotate together with the cam 32.

The second surface 324 of the cam 32 defines an annular guide 325. The annular guide 325 divides the second surface 324 into a first portion 3241 and a second portion 3242 surrounding the first portion 3241. The annular guide 325 includes a first sliding groove 3251, a second sliding groove 3255, a third sliding groove 3253, and a fourth sliding groove 3257 connected to each other in series, and the first sliding groove 3251 is opposite to the third sliding groove 3253. The first sliding groove 3251 includes two end points A, B at two ends thereof. The third sliding groove 3253 includes two end points C, D at two ends thereof. The two end points of the second sliding groove 3255 coincide with the end points A and C, and the two end points of the fourth sliding groove 3257 coincide with the end points B and D.

The first sliding groove 3251 and the third sliding groove 3253 are both circular in shape, and the cam 32 defining the locating hole 3220 as the axis of a circle. In the illustrated embodiment, the first sliding groove 3251 is adjacent to the edge of the second surface 324, the third sliding groove 3253 is adjacent to the locating hole 3220, and the central angle of the first sliding groove 3251 is equal to the central angle of the third sliding groove 3253. The second sliding groove 3255 and the fourth sliding groove 3257 are both arcuate, and are symmetrical relative to the line O-O'. The distance between the second sliding groove 3255 and the locating hole 3220 is gradually decreased from the end point A to the end point C. The distance between the fourth sliding groove 3257 and the locating hole 3220 is gradually decreased from the end point B to the end point D.

The first portion 3241 forms a first slide portion 3245 adjacent to the first sliding groove 3251. The first slide portion 3245 is substantially sectoral. The two end points of the first slide portion 3245 respectively correspond to the two end points A, B. The first slide portion 3245 perpendicularly extends out of the first portion 3241, and gradually decreasing in height of the first slide portion 3245 from the center to the two ends thereof. The second portion 3242 forms a second slide portion 3246 adjacent to the third sliding groove 3253. The second slide portion 3246 is substantially sectoral. The two end points of the second slide portion 3246 are respectively corresponding to the two end points C, D. The second slide portion 3246 perpendicularly extends out of the second portion 3242, and gradually decreasing in height of the second slide portion 3246 from the center to the two ends thereof.

Each of the two load modules 50 includes a follower 51, a restricting member 52, a clamping member 55, two guiding poles 56, a sliding pole 58, and an elastic member 59. The follower 51, the restricting member 52, and the clamping member 55 are all sleeved on the two guiding poles 56. One end of the sliding pole 58 is fastened to the restricting member 52, and the other end of the sliding pole 58 is slidably fastened to the follower 51. The elastic member 59 is sleeved on the sliding pole 58.

The follower 51 includes a main body 512 and two sliding portions 514 extending out of opposite side surfaces of the main body 512. The main body 512 defines a sliding hole 5122 at substantially the center portion of a bottom surface of the main body 512, and two fastening holes 5124 at opposite sides of the sliding hole 5122. The restricting member 52 can be a rectangular block. The restricting member 52 defines a restricting hole 522 at substantially the center portion of a bottom surface thereof and two sliding holes 524 at opposite sides of the restricting hole 522. The clamping member 55 can be a suction cup or a claw for clamping an electronic element.

The clamping member 55 defines two fastening holes 554 at opposite ends for fastening the two guiding poles 56.

FIGS. 1 through 4, show in assembly, one end of the rotary pivot 34 is rotatably fastened in the pivot hole 12 of the fastening board 10 and connected to the driving device 70, and the other end of the rotary pivot 34 is fastened in the locating hole 3220 of the cam 32. One end of each of the two guiding poles 56 is fastened in one corresponding fastening hole 5124 of the follower 51. One end of the sliding pole 58 is fastened to the restricting member 52 with the elastic member 59 sleeved on the sliding pole 58, and the other end of the sliding pole 58 is slidably received in the sliding hole 5122 of the follower 51. The restricting member 52 is sleeved on the two guiding poles 56, and the two guiding poles 56 pass through the two sliding grooves 142 respectively with the restricting member 52 received in the sliding guides 14 and resisting the supporting portion 144. The clamping member 55 is fastened to a distal end of each of the two guiding poles 56. At this time, the main body 512 is received in the annular guide 325 with one of the two sliding portions 514 resisting the second surface 324 of the cam 32.

In use, the cam 32 is rotated counterclockwise to drive the main body 512 of the follower 51 to slide along the annular guide 325 (as shown in FIG. 2). In the illustrated embodiment, one end of the sliding guide 14 adjacent to the second slide portion 3246 is the clamping end, and the other end of the sliding guide 14 is the unloading end. The initial position of one of the follower 51 is at the end point A, and each of the two load modules 50 is positioned at the clamping end of each of the two sliding guides 14. When the follower 51 slides along the annular guide 325 from the end point A to B, the follower 51 gradually slides towards the fastening board 10 and then turns to its initial position when driven by the cam 32 gradually decreasing the height of the first slide portion 3245 from the center to the two ends of the first slide portion 3245. At this time, the two followers 51 drive the two clamping members 55 into a descending movement with the two elastic members 59 being compressed. Each of the two clamping members 55 clamps an electronic element when the two clamping members 55 are at the lowest position. And then the two clamping members 55 are raised to their original height as the two elastic members 59 are sprung back to their original shape.

The cam 32 continues rotating, when the follower 51 slides along the annular guide 325 from the end point B to D, gradually decreasing the distance between the follower 51 and the locating hole 3220 until the two clamping members 55 slide into the two unloading ends of the two sliding guides 14 driven by the follower 51. When the follower 51 slides along the annular guide 325 from the end point D to C, the follower 51 gradually slides towards the fastening board 10 and then turns to its initial position driven by the cam 32 as the height of the second slide portion 3246 is gradually decreased from the center to the two ends. At this time, the two followers 51 drive the two clamping members 55 into a descending movement as the two elastic members 59 are compressed. Each of the two clamping members 55 unloads the electronic element when the two clamping members 55 are at their respective lowest positions. And then the two clamping members 55 are raised to their original height as the two elastic members 59 rebound back to their original shape. The cam 32 continues to rotate, as the follower 51 slides to the end point A, the two clamping members 55 move to their initial position, and then the loading mechanism 100 can start the next cycle.

In summary, as the cam 32 rotates, the follower 51 drives the two clamping members 55 to move horizontally and vertically, and the loading mechanism 100 can transfer electronic components from the clamping end to the unloading end of the fastening board 10.

In alternative embodiments, the load module 50 can be just one, and the loading mechanism 100 can transfer one electronic element as the cam 32 is being rotated.

While the present disclosure has been described with reference to particular embodiments, the description is illustrative of the disclosure and is not to be construed as limiting the disclosure. Therefore, various modifications can be made to the embodiments by those of ordinary skill in the art without departing from the true spirit and scope of the disclosure, as defined by the appended claims.

What is claimed is:

1. A loading mechanism, comprising:
   a fastening board defining a pivot hole at the center portion of the fastening board and a sliding guide adjacent to the pivot hole;
   a cam comprising a first surface and a second surface opposite to the first surface, the first surface defining a locating hole at the center portion thereof, and the second surface defining an annular guide, wherein the annular guide comprises a first annular sliding groove, a second annular sliding groove, a third annular sliding groove, and a fourth annular sliding groove communicating with each other in series to form a closed annular groove, the centers of the first and third annular sliding grooves coincide with the center of the locating hole;
   a rotary pivot; and
   a load module comprising two guiding poles, a follower fastened to one end of the two guiding poles, a clamping member fastened to the other end of the two guiding poles, wherein one end of the rotary pivot is rotatably fastened in the pivot hole of the fastening board, and the other end of the rotary pivot is fastened in the locating hole of the cam, the cam is capable of driven to rotate, and the cam drives the follower to slide along the first, second, third, and fourth annular sliding grooves in order to drive the load module to slide along the sliding guide;
   wherein a distance between the intersection of the first annular sliding groove and the sliding guide, and the locating hole is greater than the distance between the intersection of the third annular sliding groove and the sliding guide, and the locating hole, and the distance between the intersection of one of the second annular sliding groove and the fourth annular sliding groove and the sliding guide, and the locating hole is gradually decreased from the first annular sliding groove to the third annular sliding groove.

2. The loading mechanism of claim 1, wherein the sliding guide defines two guide sliding grooves parallel to each other at two sides thereof and forms a supporting portion formed between the two guide sliding grooves, and the two guiding poles slidably pass through the two guide sliding grooves respectively.

3. The loading mechanism of claim 2, wherein the clamping member defines two fastening holes at opposite ends thereof, the two guiding poles are fastened in the two fastening holes respectively.

4. The loading mechanism of claim 3, wherein the follower comprises a main body and two sliding portions extending out of the opposite side surfaces of the main body, the main body defines a sliding hole at the center portion of a bottom surface of the main body, the at least one load module further comprises a sliding pole, an elastic member sleeved on the sliding pole, and a restricting member, the restricting member defines a restricting hole at the center portion thereof, one end of the sliding pole slidably received in the sliding hole, and the other end of the sliding pole fastened to the restricting member.

5. The loading mechanism of claim 4, wherein the restricting member defines two sliding holes adjacent to opposite ends thereof corresponding to the two fastening holes of the clamping member, the restricting member resists with the supporting portion with the two guiding poles slidably passing through the two sliding holes respectively.

6. The loading mechanism of claim 5, wherein the annular guide divides the second surface into a first portion and a second portion surrounding the first portion, the first portion forms a first slide portion adjacent to the first sliding groove, and the second portion forms a second slide portion adjacent to the third sliding groove.

7. The loading mechanism of claim 6, wherein the first slide portion perpendicularly extends out of the first portion, and the height of the first slide portion is gradually decreased from the center to the two ends thereof.

8. The loading mechanism of claim 6, wherein the second slide portion perpendicularly extends out of the second portion, and the height of the second slide portion is gradually decreased from the center to the two ends thereof.

9. A loading mechanism comprising:
a fastening board defining a pivot hole at the center portion of the fastening board and two sliding guides at opposite sides of the pivot hole;
a cam comprising a first surface and a second surface opposite to the first surface, the first surface defining a locating hole at the center portion thereof, and the second surface defining an annular guide, wherein the annular guide comprises a first annular sliding groove, a second annular sliding groove, a third annular sliding groove, and a fourth annular sliding groove communicating with each other in series to form a closed annular groove, the centers of the first and third annular sliding grooves coincide with the center of the locating hole;
a rotary pivot; and
two load modules, each of the two load modules comprising two guiding poles, a follower fastened to one end of the two guiding poles, a clamping member fastened to the other end of the two guiding poles, wherein one end of the rotary pivot is rotatably fastened in the pivot hole, and the other end of the rotary pivot is fastened in the locating hole of the cam, the cam is capable of driven to rotate to drive the two followers to slide along the first, second, third, and fourth annular sliding grooves in order, and the two followers drive each of the two load modules to slide along one corresponding sliding guide;
wherein a distance between the intersection of the first annular sliding groove and the sliding guide, and the locating hole is greater than the distance between the intersection of the third annular sliding groove and the sliding guide, and the locating hole, and the distance between the intersection of one of the second annular sliding groove and the fourth annular sliding groove and the sliding guide, and the locating hole is gradually decreased from the first annular sliding groove to the third annular sliding groove.

10. The loading mechanism of claim 9, wherein each of the two sliding guides defines two guide sliding grooves parallel to each other at two sides thereof and forms a supporting portion formed between the two guide sliding grooves, and the two guiding poles slidably pass through the two guide sliding grooves respectively.

11. The loading mechanism of claim 10, wherein the clamping member defines two fastening holes at opposite ends thereof, the two guiding poles are fastened in the two fastening holes respectively.

12. The loading mechanism of claim 11, wherein the follower comprises a main body and two sliding portions extending out of the opposite side surfaces of the main body, the main body defines a sliding hole at the center portion of a bottom surface of the main body, the at least one load module further comprises a sliding pole, an elastic member sleeved on the sliding pole, and a restricting member, the restricting member defines a restricting hole at the center portion thereof, one end of the sliding pole slidably received in the sliding hole, and the other end of the sliding pole fastened to the restricting member.

13. The loading mechanism of claim 12, wherein the restricting member defines two sliding holes adjacent to opposite ends thereof corresponding to the two fastening holes of the clamping member, the restricting member resists with the supporting portion with the two guiding poles slidably passing through the two sliding holes respectively.

14. The loading mechanism of claim 13, wherein the annular guide divides the second surface into a first portion and a second portion surrounding the first portion, the first portion forms a first slide portion adjacent to the first sliding groove, and the second portion forms a second slide portion adjacent to the third sliding groove.

15. The loading mechanism of claim 14, wherein the first slide portion perpendicularly extends out of the first portion, and the height of the first slide portion is gradually decreased from the center to the two ends thereof.

16. The loading mechanism of claim 14, wherein the second slide portion perpendicularly extends out of the second portion, and the height of the second slide portion is gradually decreased from the center to the two ends thereof.

* * * * *